United States Patent [19]

Stokes, III

[11] Patent Number: 5,835,895

[45] Date of Patent: Nov. 10, 1998

[54] INFINITE IMPULSE RESPONSE FILTER FOR 3D SOUND WITH TAP DELAY LINE INITIALIZATION

[75] Inventor: Jack W. Stokes, III, North Bend, Wash.

[73] Assignee: Microsoft Corporation, Redmond, Wash.

[21] Appl. No.: 910,284

[22] Filed: Aug. 13, 1997

[51] Int. Cl.[6] .............................. G10L 9/00; H04N 5/21
[52] U.S. Cl. .................... 704/500; 704/200; 704/503; 381/1; 381/26
[58] Field of Search .................... 704/200, 500, 704/503; 381/1, 26

[56] References Cited

U.S. PATENT DOCUMENTS

| | | | |
|---|---|---|---|
| 4,975,954 | 12/1990 | Cooper et al. | 381/26 |
| 5,034,983 | 7/1991 | Cooper et al. | 381/310 |
| 5,119,196 | 6/1992 | Ayanoglu et al. | 348/614 |
| 5,136,651 | 8/1992 | Cooper et al. | 381/310 |
| 5,333,200 | 7/1994 | Cooper et al. | 381/1 |
| 5,648,987 | 7/1997 | Yang et al. | 375/232 |

OTHER PUBLICATIONS

"Proceedings Letters," Proceedings of the IEEE, Dec. 1972, pp. 1551–1552.

Primary Examiner—David D. Knepper
Assistant Examiner—Susan Wieland
Attorney, Agent, or Firm—Lee & Hayes, PLLC

[57] ABSTRACT

An audio processing system is used to process digital audio signals that represent sound emanating from a source that is moving through three dimensional space. The audio processing system has a filter unit that employs infinite impulse response (IIR) filters to filter the audio signals. The IIR filters have filter coefficients that change when the sound source is stationary or moves from one location to the next in the 3D space. To minimize the transient response following a coefficient change, the filter unit initializes elements in the tap delay lines of the IIR filters to non-zero values. In one implementation, the tap delay line elements are changed to a set of predetermined non-zero values. In another implementation, the tap delay line elements are initialized to the final values produced by the filter for the previous sound source location. A third implementation is to initialize the tap delay line elements to values that are a function of the new coefficients and the first sample of data at the new location. Yet another implementation is to initialize the tap delay line elements to steady state values produced in response to a step input.

36 Claims, 5 Drawing Sheets

INFINITE IMPULSE RESPONSE FILTER FOR 3D SOUND WITH TAP DELAY LINE INITIALIZATION

TECHNICAL FIELD

This invention relates to audio processing systems, and more particularly, to infinite impulse response filters used in audio processing system to filter audio signals representing sounds from a source that is stationary in or moving through three-dimensional space.

BACKGROUND OF THE INVENTION

With advances in technology including faster processors, improved graphics, and so forth, the computer is expected to become a primary mechanism for delivering streaming video, complex 3D games, interactive education tools, and the like. For the computer to establish itself as the main vehicle for multimedia, however, there is a need to improve the sound quality output by the computer. Multimedia computer products and games are becoming more sophisticated and require higher fidelity sound than is traditionally present in conventional computers.

Many advances have been made to enhance sound for computerized applications. A family of U.S. Patents issued in the names of Duane H. Cooper and Jerald L. Bauck describe a head diffraction compensated stereo system that localizes a sound source within a three-dimensional space. The Cooper-Bauck technology uses head-related transfer functions to model how sound arrives from a source in space to a listener's ears. Depending on the source location, sound travels to one ear along an approximately direct path and to the other ear along a path that must bend around the human head. As a result, the sound reaches the ears at different times, allowing the listener to sense the direction from which the sound originated.

Based on these head-related transfer functions, the system derives directional cues that are added to the stereo signal. The technology further involves canceling crosstalk to remove the distortion introduced in each ear from the opposite speaker. When reproduced, the directionally cued signals are converted to a rich sound that seems to emanate from a specific location in three-dimensional space. The Cooper-Bauck technology is found in the following patents: U.S. Pat. No. 4,893,342, which issued Jan. 9, 1990; U.S. Pat. No. 4,910,779, which issued Mar. 20, 1990; U.S. Pat. No. 4,975,954, which issued Dec. 4, 1990; U.S. Pat. No. 5,034,983, which issued Jul. 23, 1991; U.S. Pat. No. 5,136,651, which issued Aug. 4, 1992; and U.S. Pat. No. 5,333,200, which issued Jul. 26, 1994.

The Cooper-Bauck technology can be implemented using digital infinite impulse response (IIR) filters. The filters prove effective in localizing stationary sources in three-dimensional space.

In many computer applications, however, the designer wants to simulate a sound source that is moving through three-dimensional space, rather than a stationary source. For example, in a 3D game for fighter plane combat, the game designer might want an enemy jet to fly past from left to right and behind the player. To simulate this action, the sound must be presented to the player as if the source (i.e., the enemy jet) is moving in three-dimensional space just behind them from left to right.

A potentially significant problem associated with using IIR filters to localize a moving 3D source is that IIR filters inherently ring indefinitely after their filter coefficients are reset. The amplitude of the ringing depends upon the magnitude of the filter coefficients and the input data. For fast paced sounds, the filter may need to be reset rapidly, such as every few milliseconds. If the transient response caused by resetting the coefficients is large, the short filter duration could produce audible distortion for a source that moves quickly from one position to the next. A similar problem occurs for short, stationary sounds which repeat rapidly. This audible distortion degrades the sound quality, making the experience less real for the player.

The inventor has developed an improved audio processing system based on the Cooper-Bauck technology that utilizes IIR filters for localizing a stationary or moving 3D source, but minimizes the transient response resulting from changing the filter coefficients.

SUMMARY OF THE INVENTION

This invention concerns an audio processing system for processing digital audio signals that represent sound emanating from a source that is stationary or moving through three-dimensional space. The audio processing system uses a filter unit with infinite impulse response (IIR) filters to localize the audio signals. The IIR filters have filter coefficients that change when the sound source moves from one location to the next. To minimize the transient response in the IIR filters following a coefficient change, the filter unit initializes elements in the tap delay lines of the IIR filters to non-zero values. In one implementation, the tap delay line elements are changed to a set of predetermined non-zero values. In another implementation, the tap delay line elements are initialized to the final values produced by the filters for the previous sound source location. A third implementation is to initialize the tap delay line elements to values that are a function of the new coefficients and the first sample of data at the new location. Yet another implementation is to initialize the tap delay line elements to steady state values produced in response to a step input. A fifth implementation is to initialize the denominator structure's tap delay line elements to steady state values produced by a step input and the numerator structure's tap delay line elements to the final values produced by the filters for the previous sound source location.

DETAILED DESCRIPTION

Figure 1:
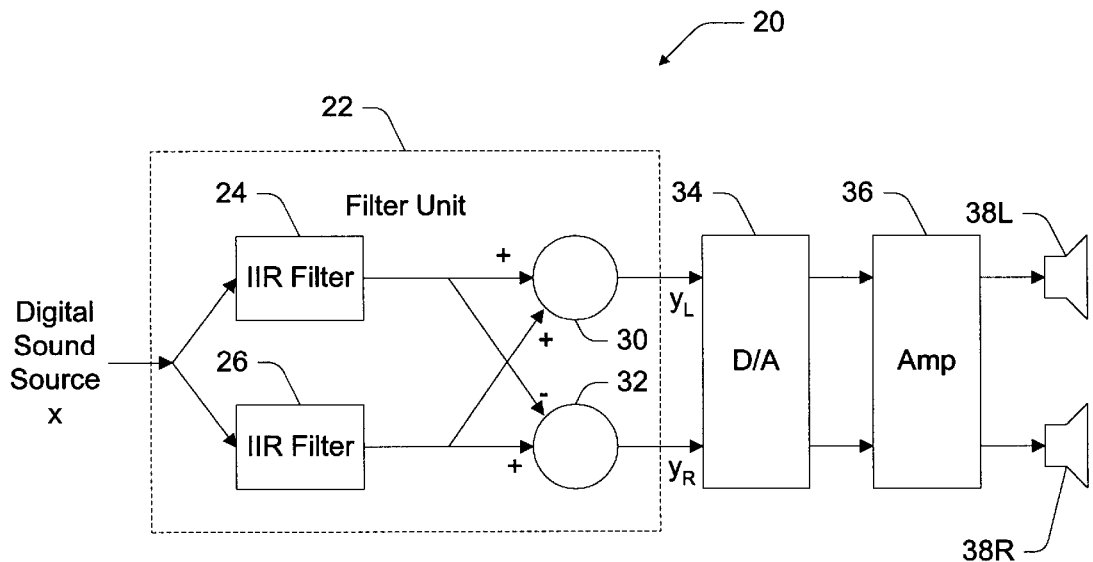
FIG. 1 is a block diagram of an audio processing system.

FIG. 1 shows an audio signal processing system 20 for processing digital audio signals that represent sound emanating from a source that is stationary or moving through three-dimensional space. The signal processing system 20 has a filter unit 22 that contains various filters to process a digital audio signal x received from a sound source. The source itself may be live or prerecorded, such as a signal received from a CD-ROM, digital video disk, cassette, and the like. The filter unit 22 has two IIR filters 24 and 26, a summer 30, and a difference 32. The IIR filters 24 and 26, together with the summer 30 and difference 32, add directional cues to the audio signal to form left and right signals that are based on head related transfer functions (HRTFs) and crosstalk cancellation to remove any crosstalk at each ear from the opposite speaker. The filter unit 22 outputs a left signal $y_L$ and a right signal $y_R$ that can be reproduced to localize the sound within a three-dimensional space.

The HRTFs and crosstalk cancellation circuit implemented in the filter unit 22 are described in the Cooper-Bauck patents identified in the background of the invention sections, which are incorporated by reference. The construction and operation of these components are well documented and will not be described in detail. The component arrangement shown in FIG. 1 is for explanation purposes, and other arrangements are possible, as discussed in the Cooper-Bauck patents.

The filter unit 22 can be implemented in hardware, software, or a combination of hardware/software. As one example, the filter unit 22 might be implemented using a digital signal processor (DSP). In another implementation, the filter unit 22 is implemented in software that executes on a central processing unit of a computer or other computer-like device. This implementation is described below in more detail with reference to FIG. 2.

When a 3D sound is to be produced, the left and right signals $y_L$ and $y_R$ are fed to a digital to analog (D/A) converter 34, which converts them to analog signals. An amplifier 36 amplifies the analog signals and outputs them to left and right stereo speakers 38L and 38R.

Figure 2:
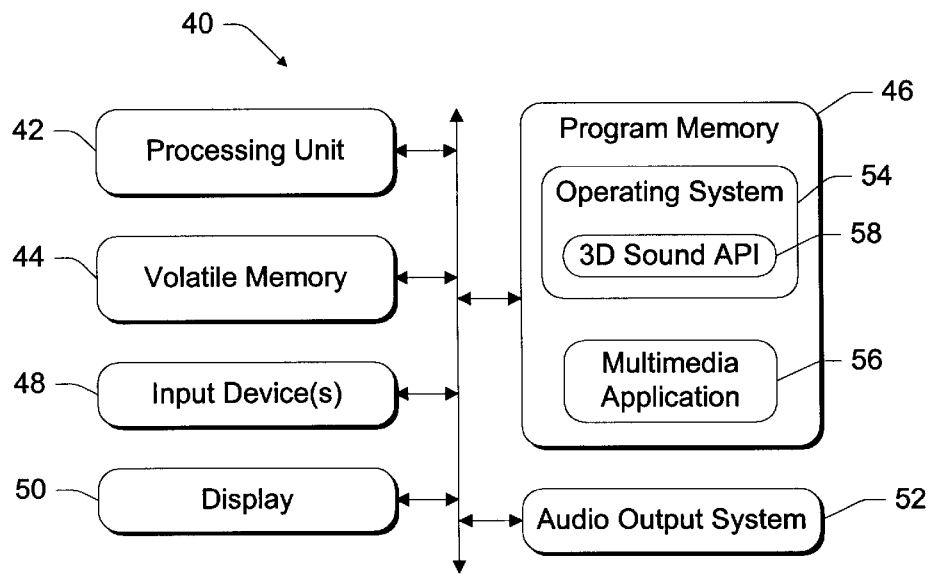
FIG. 2 is a block diagram of a computer that implements the audio processing system.

FIG. 2 shows the audio sound processing system implemented in a computer 40. The computer has a processor 42, a volatile memory 44 (e.g., RAM), and a non-volatile memory 46 (e.g., ROM, flash, hard drive, floppy drive, CD-ROM, etc.). The computer 40 also has an input device 48 (e.g., keyboard, mouse, trackball, etc.), a display 50, and an audio output system 52.

The computer 40 runs an operating system 54 that supports multiple applications. The operating system 54 is stored on the non-volatile memory 46 and executes on the processor 42. One preferred operating system is a Windows brand operating system sold by Microsoft Corporation, such as Windows 95, Windows 98, Windows NT, Windows CE or other derivative versions of Windows.

A multimedia application 56 is stored in the non-volatile memory 46. As an example, the application 56 might be a 3D game, or a multimedia program, or an application that handles streaming audio or video content, or the like. When launched, the multimedia application 56 runs on the operating system 54 while executing on the processor 42. The operating system 54 supports an application program interface (API) 58 for facilitating 3D sound generation. The API 58 specifies the interface between the application and the system software which implements the functionality specified by the API. The application 56 calls the 3D sound API 58 to produce the desired sound, including moving 3D sound sources.

Figure 3:
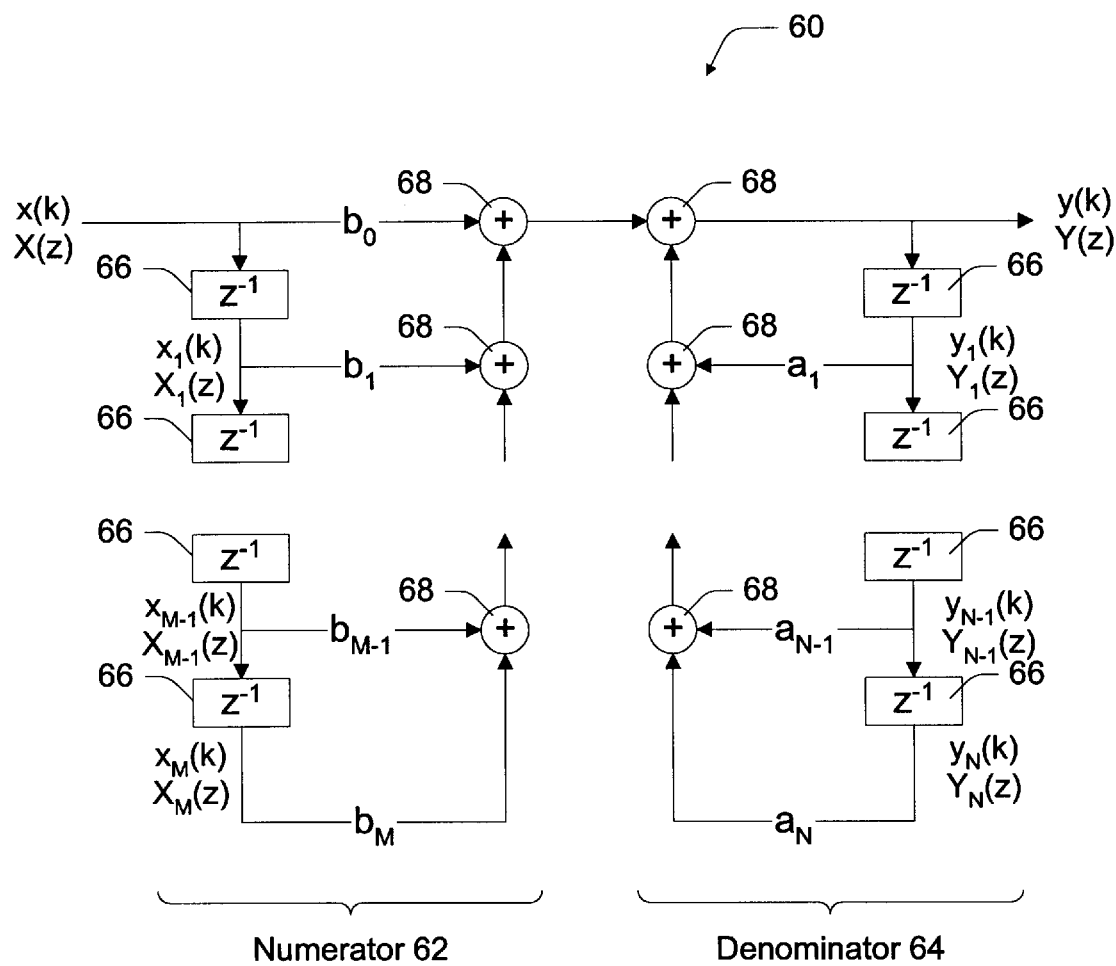
FIG. 3 is a block diagram of an IIR filter used in the FIG. 1 processing system. The IIR filter is configured in a Direct Form I type.

The filter unit 22 implemented in the operating system 54 and controlled via the API 58 utilizes infinite impulse response (IIR) filters to form the HRTFs to localize the sound. FIG. 3 shows an IIR filter 60 constructed in a Direct Form I type. IIR filter 60 has a numerator branch 62 and a denominator branch 64, both of which comprise a series of digital delay elements 66 and coefficients. The first or upper-most delay element in each branch 62 and 64 receives a sequence of discretely sampled signal values in digital form. Each delay element holds each signal value for a single sample period and then produces it for the next delay element in the series.

In the example shown, the original unfiltered signal is represented by a sequence of digital values x. The nomenclature x(k) indicates the value of x at a discrete sample time k. The output of the filter is y(k), meaning the value of y at a discrete sample time k. The unfiltered signal and output signal are represented in the frequency domain as X(z) and Y(z), respectively. The z-transforms, which can be used to derive the frequency response, of the filter unit's 22 input and output are given by X(z) and Y(z), respectively.

In the numerator branch 62, the term $x_1(k)$ indicates the output value of the numerator's $1^{th}$ tap delay line element at time k. In this article, setting $x_1(k)$ to a specific value corresponds to initializing the 1th tap delay line element to the value immediately prior to processing input sample x(k). For example, setting $x_2(O)=4$ corresponds to initializing the numerator's second tap delay element to the value 4 prior to processing the first data sample x(O). FIG. 3 assumes that each delay element 66 has a delay period of one sample period. Accordingly, at any given time, the first delay element 66 in the numerator branch accepts x(k) and outputs $x_1(k)$; the next delay element accepts $x_1(k)$ and outputs $x_2(k)$; and so forth. Similarly, the first delay element 66 in the denominator branch accepts y(k) and outputs $y_1(k)$; the next delay element accepts $y_1(k)$ and outputs $y_2(k)$; and so forth.

These sample values are fed to respective digital coefficient multipliers, as represented by a flow line with a coefficient embedded therein. For the numerator branch 62, the sample values are multiplied by respective coefficients $b_O$ through $b_M$, resulting in the terms $b_O x(k)$ through $b_M x_M(k)$. For the denominator branch 64, the sample values are multiplied by respective coefficients $a_1$ through $a_N$, resulting in the terms $a_1 y_1(k)$ through $a_N y_N(k)$. As indicated by the different numbers N and M of variables a and b, the numerator and denominator branches may be asymmetric, having a different number of delay elements 66.

Digital summing junctions 68 accept the product terms to produce a filtered signal value y(k). Over time, the filter produces a sequence of filtered signal values y, corresponding respectively to the sequence of unfiltered signal values x. The overall transfer function for the IIR filter 60 is as follows:

$$H(z) = Y(z)/X(z) = \frac{b_0 + b_1 z^{-1} + \Lambda + b_M z^{-M}}{1 - a_1 z^{-1} - \Lambda - a_N z^{-N}} \ .$$

During audio signal processing, when the sound source moves from one location to the next, the filter coefficients of the IIR filter 60 are changed. The filter unit 22 includes controls to change the IIR filter coefficients for each new 3D sound location in space. For faster moving sound sources, the IIR filters may need new filter coefficients every 5–10 milliseconds to adequately filter the sound at each new location. With a sample rate of 8 KHz and a data block size of 10 milliseconds, for example, the filter coefficients could be reset every 80 samples. When the filter coefficients are reset, the IIR filters ring indefinitely. If this transient response is large, the short filter duration could produce audible distortion for a source that moves quickly from one position to the next, thereby degrading sound quality.

Accordingly, an aspect of this invention is to initialize the tap delay line elements of the digital IIR filters to values other than zero. The filter unit 22 acts as a filter controller to initialize the tap delay elements to non-zero values when the filter coefficients are changed. The goal of setting the elements to non-zero values is to minimize the ringing in the transient response following a coefficient change. There are several techniques for initializing the tap delay line elements of the filters.

One approach is to initialize the tap delay line elements to the set of values last produced by the IIR filter when filtering the audio signal representing the sound source at the previous location in three-dimensional space. Accordingly, the values for the numerator tap delay line elements $x_1(k)$-$x_M(k)$ and the denominator tap delay line element $y1(k)$-$y_N(k)$, which are presently in volatile memory, are left as initializing values for the new filter with the new filter coefficients.

Another approach is to initialize the tap delay line elements to a set of predefined non-zero values. That is, following a coefficient change resulting from a change in location of the sound source within three-dimensional space, the filter unit initializes the numerator tap delay line elements $x_1(k)$-$x_M(k)$ and the denominator tap delay line element $y_1(k)$-$y_N(k)$ to non-zero values to help minimize the transient ring resulting from starting up the IIR filter with a new set of coefficients.

This set of values may be computed in the operating system 54, or be passed to the API 58 from the multimedia application 56. It is noted that the numerator tap delay line elements and the denominator tap delay line elements can also be initialized to different sets of non-zero values.

One specific method for initializing the tap delay elements to predefined non-zero values is to initialize the tap delay line elements to values that are a function of the new coefficients and the first sample of data at the new location. More specifically, one implementation is to initialize the elements to values of a steady state response to a step input function that is applied to the IIR filter with new coefficients. This approach is described below for the IIR filter shown in FIG. 3. Following this derivation, an initializing function is derived for three other filter types to provide different examples of how the invention can be implemented.

For Direct Form I, IIR filter 60 in FIG. 3, intermediate transfer functions of the numerator branch 62 include:

$$G_1(s) = X_1(z)/X(z) = z^{-1}$$
$$G_2(z) = X_2(z)/X(z) = z^{-2}$$
$$G_M(z) = X_M(z)/X(z) = z^{-M}$$

Intermediate transfer functions of the denominator branch 64 include:

$$H_1(z) = Y_1(z)/X(z) = z^{-1}H(z)$$
$$H_2(z0 = Y_2(z)/X(z) = z^{-2}H(z)$$
$$H_N(z) = Y_N(z)/X(z) = z^{-N}H(z).$$

To determine a steady-state response of the IIR filter 60, the final value theorem for discrete-time systems is applied. This theorem is described in the text by C. L. Phillips and H. T. Nagle Jr., entitled "Digital Control System Analysis and Design," and published by Prentice-Hall, Inc. Englewood Cliffs, N.J., 1984. Other texts also describe the theorem. Given that the z-transform of an error, $e(k) = x(k) - x(k-1)$, is $E(z)$, $$\lim_{k \to \infty} e(k) = \lim_{z \to 1} (z-1)E(z)$$

The z-transform for a step input of value K is:

$$X(z) = \frac{Kz}{z-1}.$$

For a step input of value K, the z-transform of the time domain signal at each of the denominator tap delay elements is as follows:

$$Y_n(z) = z^{-n}H(z)X(z) = z^{-n}\left(\frac{b_0 + b_1 z^{-1} + \Lambda + b_M z^{-M}}{1 - a_1 z^{-1} - \Lambda - a_N z^{-N}}\right)\left(\frac{Kz}{z-1}\right)$$

$$1 \leq n \leq N.$$

Applying the final value theorem, the steady-state value of each denominator, tap delay element is as follows:

$$\lim_{k \to \infty} y_1(k) = \lim_{k \to \infty} y_2(k) = \Lambda = \lim_{k \to \infty} y_N(k) =$$

$$K\left(\frac{b_0 + b_1 + \Lambda + b_M}{1 - a_1 - \Lambda - a_N}\right) = K\left(\sum_{m=0}^{M} b_m/1 - \sum_{n=1}^{N} a_n\right).$$

As a source moves from one 3D position to the next thereby requiring a new set of IIR filter coefficients at sample k=j, each of the denominator tap delay line elements are initialized to the following:

$$y_n(j) = x(j)\left(\sum_{m=0}^{M} b_m/1 - \sum_{n=1}^{N} a_n\right)$$

$$1 \leq n \leq N$$

where x(j) is the first sample to be localized at the new position.

For a step input of value K, the z-transform of the time domain signal at each of the numerator tap delay elements is:

$$X_m(z) = z^{-m}X(z) = z^{-m}\left(\frac{Kz}{z-1}\right)$$

$$1 \leq m \leq M.$$

Applying the final value theorem, the steady-state value of each the numerator's tap delay elements is as follows:

$$\lim_{k \to \infty} x_1(k) = \lim_{k \to \infty} x_2(k) = \Lambda = \lim_{k \to \infty} x_M(k) = K.$$

Thus, each of the numerator tap delay line elements is initialized as follows:

$$x_m(j) = x(j) \quad 1 \leq m \leq M$$

where x(j) is the first sample to be localized at the new position.

Another method for initializing the numerator tap delay elements for IIR filter 60 includes using the past M−1 samples. Thus, each of the tap delay line elements in the numerator branch 62 is initialized as follows:

$$x_{m-j}(j) = x(j-m+1) \quad 1 \leq m \leq M$$

where x(j) is the first sample to be localized at the new position and x(j−k) is from the input data localized at the previous position. Another approach is for the denominator structure's tap delay lines to be initialized to the steady state response to a step input while the numerator structure's tap delay elements for IIR filter 60 using the past M−1 samples. It is further noted that the tap delay lines can be initialized with input responses other than a step input, such as an impulse or a sinusoidal.

Figure 4:
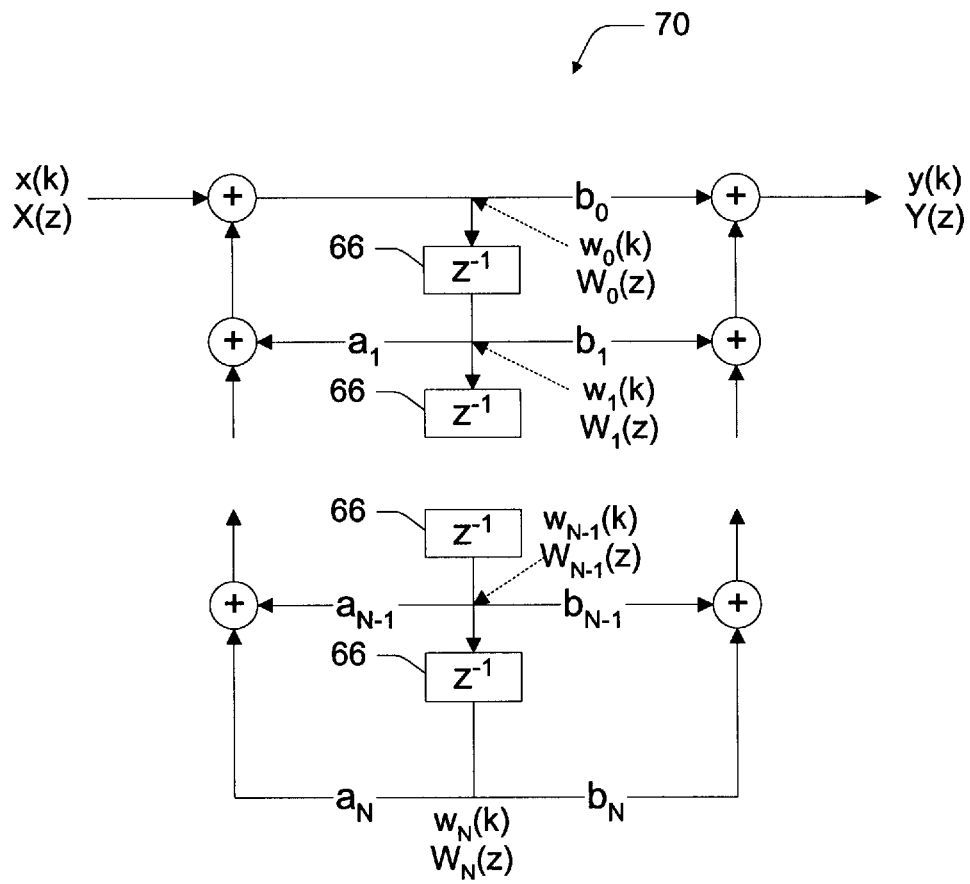
FIG. 4 is a block diagram of an IIR filter used in the FIG. 1 processing system, but configured in a Direct Form II type.

FIG. 4 shows an IIR filter 70 constructed in a Direct Form II type. Like the Direct Form I, IIR filter 60 of FIG. 3, the overall transfer function for the IIR filter 70, Direct Form II type, is as follows:

$$H(z) = Y(z)/X(z) = \frac{b_0 + b_1 z^{-1} + \Lambda + b_N z^{-N}}{1 - a_1 z^{-1} - \Lambda - a_N z^{-N}}$$

The intermediate transfer functions to the tap delay line elements are $$H_1(z) = W_1(z)/X(z) = z^{-1} H_0(z)$$
$$H_2(z) = W_2(z)/X(z) = z^{-2} H_0(z)$$
$$H_N(z) = W_N(z)/X(z) = z^{-N} H_0(z)$$

where $$H_0(z) = W_0(z)/X(z) = \frac{1}{1 - a_1 z^{-1} - \Lambda - a_N z^{-N}}.$$

For a step input of value K, the z-transform of the time domain signal at each tap delay element is as follows:

$$W_n(z) = H_n(z)X(z) = z^{-n} \left( \frac{1}{1 - a_1 z^{-1} - \Lambda - a_N z^{-N}} \right) \left( \frac{Kz}{z-1} \right)$$

$$1 \leq n \leq N.$$

Applying the final value theorem, the steady-state value of each tap delay element is as follows:

$$\lim_{k \to \infty} w_1(k) = \lim_{k \to \infty} w_2(k) = \Lambda = \lim_{k \to \infty} w_N(k) =$$

$$K \left( \frac{1}{1 - a_1 - \Lambda - a_N} \right) = \left( K/1 - \sum_{n=1}^{N} a_n \right).$$

As a source moves from one 3D position to the next thereby requiring a new set of IIR filter coefficients at sample k=j, each of the tap delay line elements is initialized as follows:

$$w_n(j) = x(j) \left( 1/1 - \sum_{n=1}^{N} a_n \right)$$

$$1 \leq n \leq N$$

where x(j) is the first sample to be localized at the new position.

Figure 5:
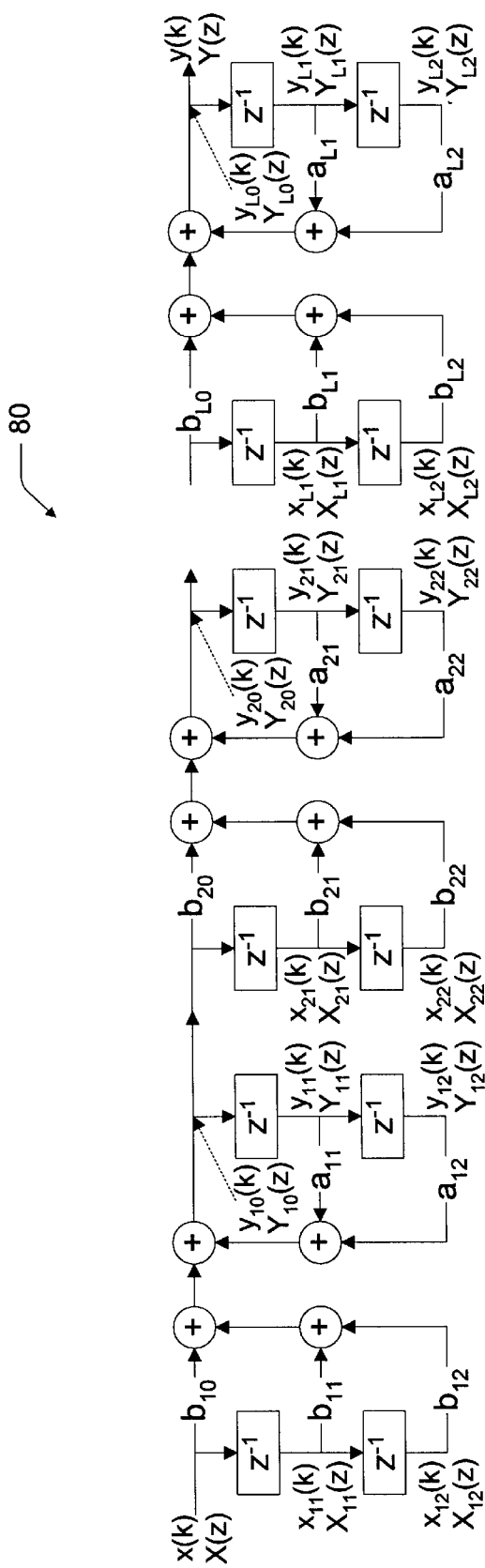
FIG. 5 is a block diagram of an IIR filter used in the FIG. 1 processing system, but configured in a Direct Form I, Cascaded Biquad type.

FIG. 5 shows an IIR filter 80 constructed in a Direct Form I, Cascaded Biquad type. The overall transfer function for the DFI, Biquad IIR filter is as follows:

$$H(z) = Y(z)/X(z) = \prod_{l=1}^{L} \frac{b_{l0} + b_{l1} z^{-1} + b_{l2} z^{-2}}{1 - a_{l1} z^{-1} - a_{l2} z^{-2}}$$

where L is the number of biquads.

The right-half side of the $q^{th}$ biquad implements the $q^{th}$ biquad transfer function's denominator. Intermediate transfer functions of the denominator terms include:

$$H_{q0}(z) = Y_{q0}(z)/X(z) = \sum_{l=1}^{q} \frac{b_{l0} + b_{l1} z^{-1} + b_{l2} z^{-2}}{1 - a_{l1} z^{-1} - a_{l2} z^{-2}}$$

$$H_{q1}(z) = Y_{q1}(z)/X(z) = z^{-1} H_{q0}(z)$$

$$H_{q2}(z) = Y_{q2}(z)/X(z) = z^{-2} H_{q0}(z).$$

The left-half side of the $q^{th}$ biquad implements the $q^{th}$ biquad transfer function's numerator. Intermediate transfer functions of the numerator terms include:

$$G_{q1}(z) = X_{q1}(z)/X(z) = z^{-1} H_{q-1,0}(z)$$

$$G_{q2}(z) = X_{q2}(z)/X(z) = z^{-2} H_{q-1,0}(z)$$

where $$H_{00}(z) = 1.$$

For a step input of value K, the z-transform of the time domain signal at each of the denominator's tap delay elements is as follows:

$$Y_{qn}(z) = z^{-n} \sum_{l=1}^{q} \left( \frac{b_{l0} + b_{l1} z^{-1} + b_{l2} z^{-2}}{1 - a_{l1} z^{-1} - a_{l2} z^{-2}} \right) \left( \frac{Kz}{z-1} \right)$$

$$1 \leq n \leq 2.$$

Applying the final value theorem, the steady-state value of each denominator, tap delay element is as follows:

$$\lim_{k \to \infty} y_{q1}(k) = \lim_{k \to \infty} y_{q2}(k) = K \sum_{l=1}^{q} \left( \frac{b_{l0} + b_{l1} + b_{l2}}{1 - a_{l1} - a_{l2}} \right).$$

As a source moves from one 3D position to next thereby requiring a new set of IIR filter coefficients at sample k=j, each of the tap delay line elements should be initialized to the following:

$$y_n(j) = x(j) \sum_{l=1}^{q} \frac{b_{l0} + b_{l1} + b_{l2}}{1 - a_{l1} - a_{l2}}$$

$$1 \leq n \leq 2$$

where x(j) is the first sample to be localized at the new position.

For a step input of value K, the z-transform of the time domain signal at 22 each of the denominator tap delay elements is as follows:

$$X_{qn}(z) = z^{-n} H_{q-1,0} X(z) =$$

$$z^{-n} \left( \sum_{l=1}^{q-1} \frac{b_{l0} + b_{l1} z^{-1} + b_{l2} z^{-2}}{1 - a_{l1} z^{-1} - a_{l2} z^{-2}} \right) \left( \frac{Kz}{z-1} \right)$$

$$1 \leq n \leq 2.$$

Applying the final value theorem, the steady-state value of each of the numerator's tap delay elements is as follows:

$$\lim_{k \to \infty} x_{q1}(k) = \lim_{k \to \infty} x_{q2}(k) = K \sum_{l=1}^{q-1} \frac{b_{l0} + b_{l1} + b_{l2}}{1 - a_{l1} - a_{l2}}.$$

Thus, each of the tap delay line elements in the numerator branches is initialized to:

$$x_{qn}(j) = x(j) \sum_{l=1}^{q-1} \frac{b_{l0} + b_{l1} + b_{l2}}{1 - a_{l1} - a_{l2}}$$

$$1 \leq n \leq 2$$

where x(j) is the first sample to be localized at the new position.

Figure 6:
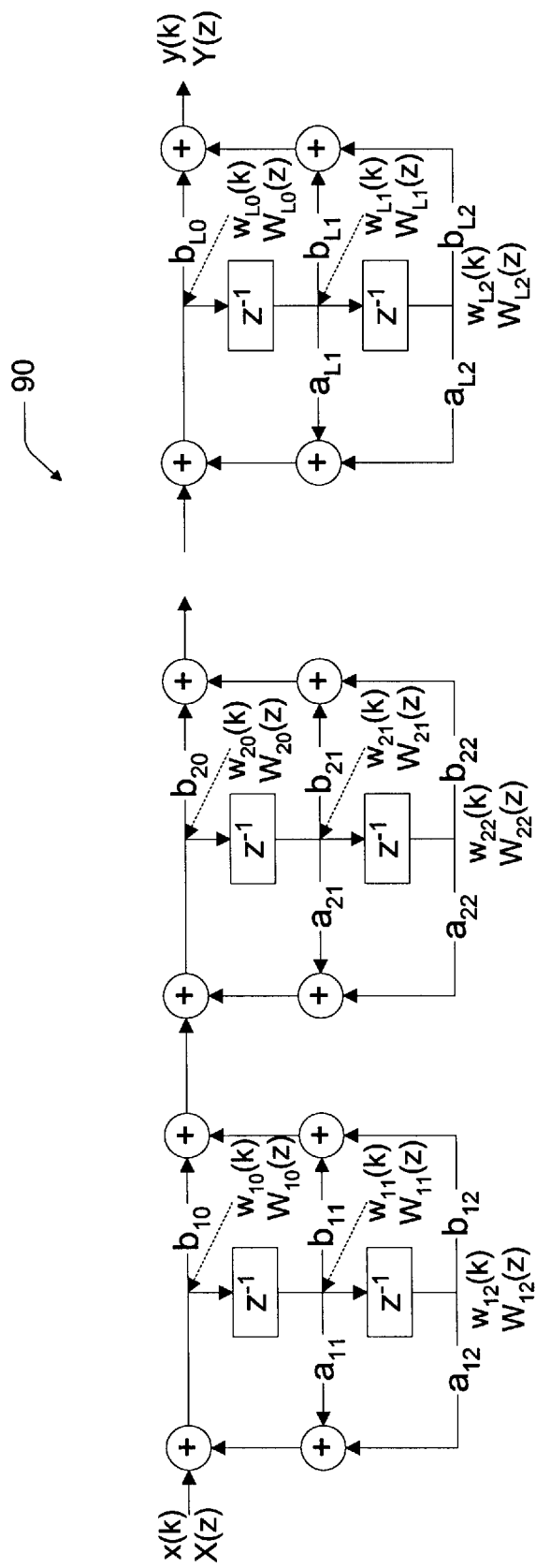
FIG. 6 is a block diagram of an IIR filter used in the FIG. 1 processing system, but configured in a Direct Form II, Cascaded Biquad type.

FIG. 6 shows an IIR filter 90 constructed in a Direct Form II, Cascaded Biquad type. Like IIR filter 80 in FIG. 5, the overall transfer function for the IIR filter 90 is as follows:

$$H(z) = Y(z)/X(z) = \prod_{l=1}^{L} \frac{b_{l0} + b_{l1}z^{-1} + b_{l2}z^{-2}}{1 - a_{l1}z^{-1} - a_{l2}z^{-2}}$$

The intermediate transfer functions to the tap delay line elements are as follows:

$$H_{q1}(z) = W_{q1}(z)/X(z) = z^{-1}H_{q0}(z)$$

$$H_{q2}(z) = W_{q2}(z)/X(z) = z^{-2}H_{q0}(z)$$

where $$H_{q0}(z) = W_{q0}(z)/X(z) =$$

$$\frac{1}{1 - a_{q1}z^{-1} - a_{q2}z^{-2}} \left( \sum_{l=1}^{q-1} \frac{b_{l0} + b_{l1}z^{-1} + b_{l2}z^{-2}}{1 - a_{l1}z^{-1} - a_{l2}z^{-2}} \right).$$

For a step input of value K, the z-transform of the time domain signal at each tap delay element is as follows:

$$W_{qn}(z) = H_{qn}(z)X(z) = z^{-n} \left( \frac{1}{1 - a_{q1}z^{-1} - a_{q2}z^{-2}} \right) \left( \sum_{l=1}^{q-1} \frac{b_{l0} + b_{l1}z^{-1} + b_{l2}z^{-2}}{1 - a_{l1}z^{-1} - a_{l2}z^{-2}} \right) \left( \frac{Kz}{z-1} \right)$$

$$1 \leq n \leq 2.$$

Applying the final value theorem, the steady-state value of each of the tap delay element is as follows:

$$\lim_{k \to \infty} w_{l1}(k) = \lim_{k \to \infty} w_{l2}(k) =$$

$$K \left( \frac{1}{1 - a_{q1} - a_{q2}} \right) \left( \sum_{l=1}^{q-1} \frac{b_{l0} + b_{l1} + b_{l2}}{1 - a_{l1} - a_{l2}} \right).$$

As a source moves from one 3D position to next thereby requiring a new set of IIR filter coefficients at sample k=j, each of the tap delay line elements is initialized as follows:

$$w_{qn}(j) = x(j) \left( \frac{1}{1 - a_{q1} - a_{q2}} \right) \left( \sum_{l=1}^{q-1} \frac{b_{l0} + b_{l1} + b_{l2}}{1 - a_{l1} - a_{l2}} \right)$$

$$1 \leq n \leq 2$$

where x(j) is the first sample to be localized at the new position.

In some implementations of the IIR filters 60, 70, 80, and 90, an overall gain is included either before or after the numerator and denominator branches. If the overall gain is included before the numerator and denominator branches, it is included in the initialization algorithm. If the overall gain is applied after the numerator and denominator branches, it does not affect the initialization algorithm.

The four types of IIR filters in FIGS. 3–6 are provided for example purposes. In addition to the four types shown, this invention can be implemented using other IIR filter constructions. Additional examples of suitable filter types include Direct Form I, Transpose; Direct Form II, Transpose; Direct Form I, Cascaded Biquads Transpose; and Direct Form II, Cascaded Biquads Transpose.

It is noted that the tap delay line elements in the numerator branch can be initialized using a different technique than is used for denominator tap delay elements. For example, the numerator tap delay line elements might be initialized to a set of preknown non-zero values, whereas the denominator tap delay line elements might be initialized to the steady state response of a K step input, as discussed above.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

I claim:

1. An audio signal processing system comprising:
   a filter unit to localize a digital audio signal representing a sound that is moving through three-dimensional space from a first location to a second location, the filter unit having an infinite impulse response (IIR) filter with filter coefficients that change when the sound is stationary or moving from the first location to the second location, the filter unit initializing elements in tap delay lines of the IIR filter to non-zero values when the filter coefficients are changed to accommodate the location of the sound;
   a digital to analog (D/A) converter connected to the filter unit to convert the filtered audio signal to an analog signal; and
   an amplifier connected to the D/A converter to amplify the analog signal.

2. An audio signal processing system as recited in claim 1 wherein the tap delay line elements of the IIR filter are initialized to a predetermined set of non-zero values.

3. An audio signal processing system as recited in claim 1 wherein the tap delay line elements of the IIR filter are initialized to a set of values last produced by the IIR filter when filtering the audio signal representing the sound at the first location in the three-dimensional space.

4. An audio signal processing system as recited in claim 1 wherein the tap delay line elements of the IIR filter are initialized to steady state values in response to a step input.

5. An audio signal processing system as recited in claim 1 wherein the tap delay line elements of the IIR filter are initialized to values based on a function of the filter coefficients and a first data sample taken at the second location.

6. An audio signal processing system as recited in claim 1 wherein the IIR filter comprises numerator tap delay line elements and denominator tap delay line elements, the filter unit initializing the numerator tap delay line elements to values produced at past samples taken at the first location and a first sample taken at the second location.

7. An audio signal processing system as recited in claim 1 wherein the IIR filter comprises numerator tap delay line elements and denominator tap delay line elements, the filter unit initializing the numerator tap delay line elements to values produced at past samples taken at the first location and initializing the denominator tap delay line elements to steady state values in response to a step input.

8. An audio signal processing system as recited in claim 1 wherein the IIR filter comprises numerator tap delay line elements and denominator tap delay line elements, the filter unit initializing the numerator tap delay line elements to a first set of non-zero values and the denominator tap delay line elements to a second set of non-zero values that are different than the first set.

9. An audio signal processing system for localizing three-dimensional sound from a source that is stationary in or moving through three-dimensional space, comprising:

an infinite impulse response (IIR) filter having a set of coefficients and tap delay line elements; and a filter controller to change the filter coefficients as the sound source moves to new locations in the three-dimensional space, the filter controller also reinitializing the tap delay line elements to non-zero values when the filter coefficients are changed.

10. An audio signal processing system as recited in claim 9 wherein the IIR filter is configured according to a filter type selected from a group of filter types comprising standard direct form I, standard direct form II, direct form I—cascaded biquads, direct form II—cascaded biquads, standard direct form I transpose, standard direct form II transpose, direct form I—cascaded biquads transpose, and direct form II—cascaded biquads transpose.

11. An audio signal processing system as recited in claim 9 wherein the filter controller re-initializes the tap delay line elements of the IIR filter to a predetermined set of non-zero values.

12. An audio signal processing system as recited in claim 9 wherein the filter controller re-initializes the tap delay line elements of the IIR filter to a set of values last produced by the IIR filter when the sound source was at a previous location in the three-dimensional space.

13. An audio signal processing system as recited in claim 9 wherein the filter controller re-initializes the tap delay line elements of the IIR filter to steady state values in response to a step input.

14. An audio signal processing system as recited in claim 9 wherein the filter controller re-initializes the tap delay line elements of the IIR filter to values as a function of the filter coefficients and a first data sample taken at a newest location of the sound source.

15. In a computer-implemented audio processing system in which audio signals representing a sound from a source that is stationary or moving through three-dimensional space are passed through an infinite impulse response (IIR) filter, a computer-executable code embodied on a computer-readable medium comprising:

code means for resetting filter coefficients in the IIR filter as the sound source moves to new locations in the three-dimensional space; and code means for initializing filter elements in tap delay lines of the IIR filter to non-zero values after the filter coefficients are reset.

16. A computer-executable code as recited in claim 15 further comprising code means for initializing the filter elements of the IIR filter to a predetermined set of non-zero values.

17. A computer-executable code as recited in claim 15 further comprising code means for initializing the filter elements of the IIR filter to a set of values last produced by the IIR filter when filtering the audio signal representing the sound at the first location in the three-dimensional space.

18. A computer-executable code as recited in claim 15 further comprising code means for initializing the filter elements of the IIR filter to steady state values in response to a step input.

19. A computer-executable code as recited in claim 15 further comprising code means for initializing the filter elements of the IIR filter to values based on the filter coefficients and a first data sample taken at the second location.

20. An audio signal processor comprising:

receiving means for receiving a first digital audio signal representing a sound from a source that is positioned at a first location in three-dimensional space;

filtering means for filtering the first audio signal using an infinite impulse response (IIR) filter with a first set of coefficients;

said receiving means subsequently receiving a second digital audio signal representing the sound when the source is moved to a second location in the three-dimensional space;

means for determining a second set of coefficients for the IIR filter for use in filtering the second audio signal;

initialization means for initializing tap delay line elements in the IIR filter to non-zero values; and said filtering means filtering the second audio signal using the IIR filter with the second set of coefficients and the initialized tap delay line elements.

21. An audio signal processor as recited in claim 20 wherein the initialization means initializes the tap delay line elements in the IIR filter to a predetermined set of non-zero values.

22. An audio signal processor as recited in claim 20 wherein the is initialization means initializes the tap delay line elements in the IIR filter to a set of values last produced by the IIR filter when filtering the audio signal representing the sound at the first location in the three-dimensional space.

23. An audio signal processor as recited in claim 20 wherein the initialization means initializes the tap delay line elements in the IIR filter to steady state values in response to a step input.

24. An audio signal processor as recited in claim 20 wherein the initialization means initializes the tap delay line elements in the IIR filter to values based on the filter coefficients and a first data sample taken at the second location.

25. A method for processing an audio signal representing a sound from a source that is stationary in or moving through three-dimensional space, comprising the following steps:

receiving a first digital audio signal representing a sound from a source that is positioned at a first location in three-dimensional space;

filtering the first audio signal using an infinite impulse response (IIR) filter with a first set of coefficients;

receiving a second digital audio signal representing the sound when the source is moved to a second location in the three-dimensional space;

determining a second set of coefficients for the IIR filter for use in filtering the second audio signal;

initializing tap delay line elements in the IIR filter to non-zero values; and filtering the second audio signal using the IIR filter with the second set of coefficients and the initialized tap delay line elements.

26. A method as recited in claim 25 wherein the initializing step comprises the step of initializing the tap delay line elements in the IIR filter to a predetermined set of non-zero values.

27. A method as recited in claim 25 wherein the initializing step comprises the step of initializing the tap delay line elements in the IIR filter to a set of values last produced by the IIR filter when filtering the audio signal representing the sound at the first location in the three-dimensional space.

28. A method as recited in claim 25 wherein the initializing step comprises the step of initializing the tap delay line elements in the IIR filter to steady state values in response to a step input.

29. A method as recited in claim 25 wherein the initializing step comprises the step of initializing the tap delay line elements in the IIR filter to values based on the filter coefficients and a first data sample taken at the second location.

30. A computer-readable medium comprising computer-executable instructions for performing the steps in the method as recited in claim 25.

31. In an audio processing system in which audio signals representing a sound from a source that is stationary in or moving through three-dimensional space are passed through an infinite impulse response (IIR) filter, a method for adjusting the IIR filter to handle the moving sound source comprising the following steps:

resetting filter coefficients in the IIR filter as the sound source moves to new locations in the three-dimensional space; and initializing filter elements in tap delay lines of the IIR filter to non-zero values after the filter coefficients are reset.

32. A method as recited in claim 31 wherein the initializing step comprises the step of initializing the filter elements in the IIR filter to a predetermined set of non-zero values.

33. A method as recited in claim 31 wherein the initializing step comprises the step of initializing the filter elements in the IIR filter to a set of values last produced by the IIR filter when filtering the audio signal representing the sound at the first location in the three-dimensional space.

34. A method as recited in claim 31 wherein the initializing step comprises the step of initializing the filter elements in the IIR filter to steady state values in response to a step input.

35. A method as recited in claim 31 wherein the initializing step comprises the step of initializing the filter elements in the IIR filter to values based on the filter coefficients and a first data sample taken at the second location.

36. A computer-readable medium comprising computer-executable instructions for performing the steps in the method as recited in claim 31.

* * * * *